(12) United States Patent
Ramprasad

(10) Patent No.: US 7,248,090 B2
(45) Date of Patent: Jul. 24, 2007

(54) MULTI-THRESHOLD MOS CIRCUITS

(75) Inventor: Sumant Ramprasad, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 89 days.

(21) Appl. No.: 11/120,388

(22) Filed: May 2, 2005

(65) Prior Publication Data
US 2006/0152267 A1 Jul. 13, 2006

Related U.S. Application Data

(60) Provisional application No. 60/642,934, filed on Jan. 10, 2005.

(51) Int. Cl.
*H03K 3/289* (2006.01)
*H03K 3/356* (2006.01)

(52) U.S. Cl. .................. 327/202; 327/203; 327/208; 327/218

(58) Field of Classification Search .................. None
See application file for complete search history.

(56) References Cited

U.S. PATENT DOCUMENTS

| | | | | |
|---|---|---|---|---|
| 5,982,211 | A * | 11/1999 | Ko | 327/202 |
| 6,246,266 | B1 * | 6/2001 | Bosshart | 326/98 |
| 6,492,854 | B1 | 12/2002 | Ku et al. | 327/202 |
| 6,538,471 | B1 * | 3/2003 | Stan et al. | 326/46 |
| 6,794,914 | B2 * | 9/2004 | Sani et al. | 327/202 |
| 6,870,412 | B2 * | 3/2005 | Cho | 327/202 |
| 2002/0005557 | A1 * | 1/2002 | Kodama | 257/421 |
| 2003/0218231 | A1 | 11/2003 | Sani et al. | 257/500 |
| 2004/0090256 | A1 | 5/2004 | Cho et al. | 327/202 |
| 2004/0108884 | A1 * | 6/2004 | Morikawa | 327/530 |
| 2005/0184758 | A1 * | 8/2005 | Hoberman et al. | 326/83 |

OTHER PUBLICATIONS

1-V Power Supply High Speed Digital Circuit Technology with Multithreshold-Voltage CMOS; utoh, et al., IEEE Journal of Solid State Circuits, vol. 30, No. 8 (1995).
A 1-V Power Supply High-Speed MTCMOS Circuit Scheme for Power-Down Application Circuits, Shigematsu, IEEE Journal of Solid State Circuits, vol. 32, No. 6 (1997).
Shigematsu, Satoshi, et al; "A 1-V High-Speed MTCMOS Circuit Scheme for Power-Down Application Circuite". IEEE; vol. 32, No. 6, Jun. 1997. pp. 861-869.

* cited by examiner

*Primary Examiner*—Tuan T. Lam
(74) *Attorney, Agent, or Firm*—Thomas Rouse; Charles D. Brown; Kenyon S. Jenckes

(57) ABSTRACT

A multi-threshold flip-flop includes a master latch, a slave latch, and at least one control switch. The master latch is composed of an input buffer formed with low threshold (LVT) transistors and a first latch circuit formed with LVT transistors. The slave latch is composed of a second latch circuit formed with high threshold (HVT) transistors and an output driver formed with LVT transistors. The at least one control switch enables or disables the LVT transistors and is implemented with at least one HVT transistor. The LVT and HVT transistors may be N-FETs and/or P-FETs. The multi-threshold flip-flop can operate at high speed, has low leakage current, and can save the logic state when disabled.

17 Claims, 4 Drawing Sheets

MULTI-THRESHOLD MOS CIRCUITS

This application claims the benefit of provisional U.S. Application Ser. No. 60/642,934, entitled "A Multi-Threshold MOS Flip-Flop Circuit," filed Jan. 10, 2005.

BACKGROUND

I. Field

The present invention relates generally to electronic circuits, and more specifically to metal oxide semiconductor (MOS) circuits.

II. Background

Integrated circuit (IC) fabrication technology continually improves and, as a result, the size of transistors continues to shrink. This enables more transistors and more complicated circuits to be fabricated on an IC die or, alternatively, a smaller IC die to be used for a given circuit. Smaller transistor size also supports faster operating speed and provides other benefits.

For complementary metal oxide semiconductor (CMOS), which is widely used for digital circuits and some analog circuits, a major issue with shrinking transistor size is leakage current. Smaller geometry for a transistor results in higher electric field, which stresses the transistor and causes oxide breakdown. To decrease the electric field, a lower power supply voltage may be used for the smaller geometry transistor. Unfortunately, the lower power supply voltage also increases the delay of the transistor, which is undesirable for a high-speed circuit. To reduce the delay and improve operating speed, the threshold voltage (Vt) of the transistor may be reduced. The threshold voltage is the voltage at which the transistor turn on. However, the lower threshold voltage and smaller geometry result in higher leakage current, which is the current passing through the transistor when it is turned off.

Leakage current is more problematic as CMOS technology scales smaller. This is because leakage current increases at a high rate with respect to the decrease in transistor size. Leakage current is also more problematic for certain applications such as portable devices, e.g., cellular phones and laptop computers. Leakage current consumes battery power and reduces standby time for portable devices that use internal batteries.

Reducing leakage current without sacrificing too much performance is a major challenge in CMOS designs, especially as IC technology scales down to 90 nm (nanometer) and smaller. A CMOS circuit that is constructed entirely using high threshold (HVT) transistors has low leakage current but is also slow. A CMOS circuit that is constructed entirely using low threshold (LVT) transistors is faster but has high leakage current.

There is therefore a need in the art for CMOS circuits having good performance and low leakage current.

SUMMARY

Multi-threshold MOS circuits (e.g., flip-flops) having good performance and low leakage current are described herein. In one embodiment, a multi-threshold flip-flop includes a master latch, a slave latch, and at least one control switch. The master latch is composed of an input buffer formed with LVT transistors and a first latch circuit formed with LVT transistors. The slave latch is composed of a second latch circuit formed with HVT transistors and an output driver formed with LVT transistors. Each latch circuit may be formed with (1) two inverters and a pass switch coupled in a feedback configuration and (2) another pass switch coupled between one inverter and the latch circuit input. The at least one control switch enables or disables the LVT transistors for the flip-flop. Each control switch is implemented with an HVT transistor and may be a footswitch or a headswitch. The LVT and HVT transistors may be N-channel field effect transistors (N-FETs) and/or P-channel FETs (P-FETs).

The multi-threshold flip-flop can operate at high speed since (1) the latch circuit in the master latch is composed of LVT transistors and setup time for the flip-flop is reduced and (2) the output driver in the slave latch is also composed of LVT transistors and the clock-to-output time is also reduced. The multi-threshold flip-flop has low leakage current since the control switches are turned off and present low leakage paths when the flip-flop is disabled. The multi-threshold flip-flop can save the current logic state when the flip-flop is disabled since (1) the slave latch is composed of HVT transistors without a control switch and (2) the clock is maintained at a proper logic value when in a sleep mode.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The circuit design techniques described herein may be used for various MOS circuits. For clarity, these techniques are specifically described below for D flip-flops.

Figure 1:
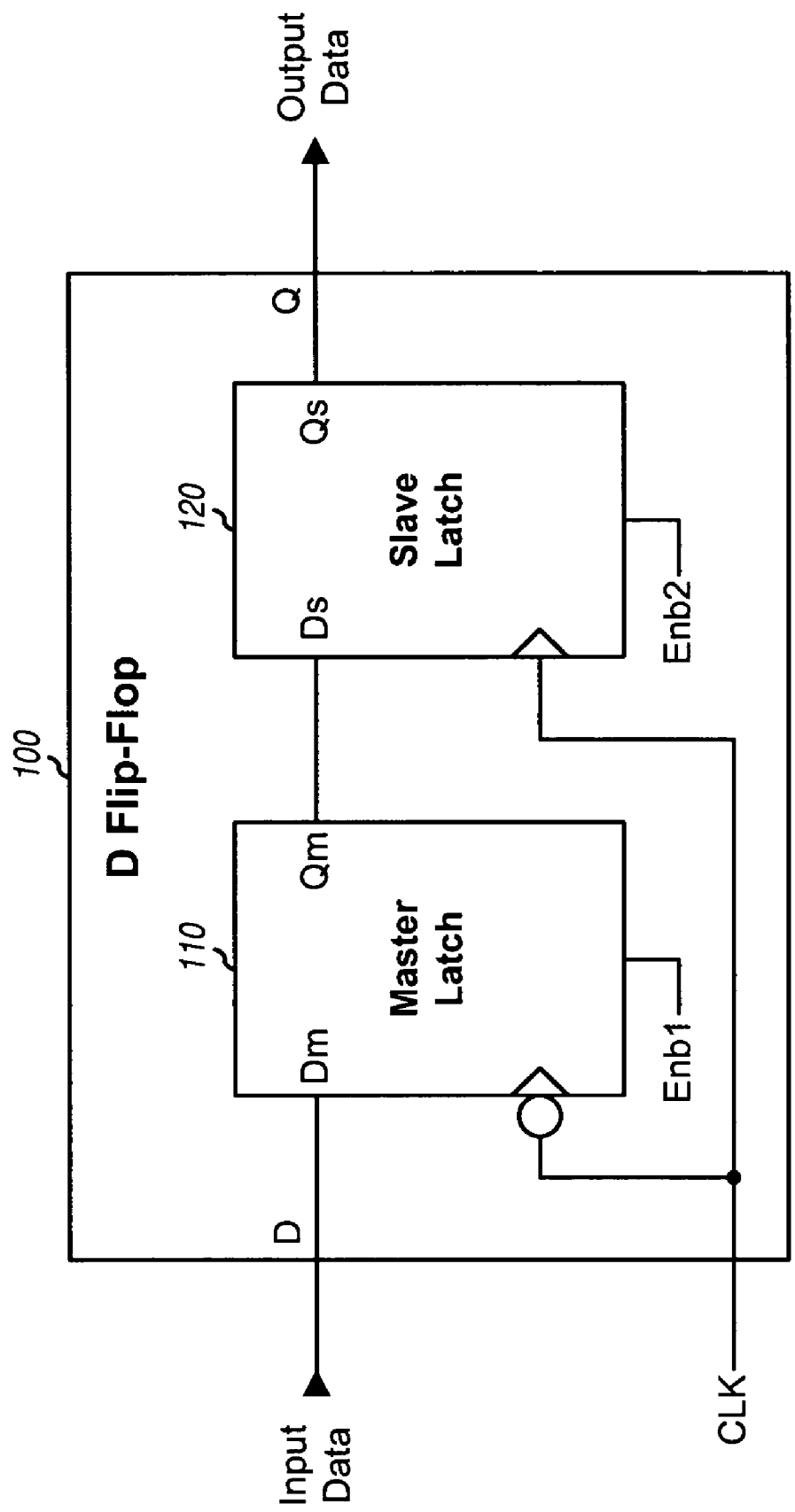
FIG. 1 shows a block diagram of a D flip-flop circuit.

FIG. 1 shows a block diagram of a D flip-flop circuit 100 that includes a master latch 110 and a slave latch 120. Master latch 110 has a data input (Dm), a data output (Qm), a clock input, and an enable input. Slave latch 120 has a data input (Ds), a data output (Qs), a clock input, and an enable input. The data input of master latch 110 represents a data input (D) of D flip-flop 100. The data output of master latch 110 is coupled to the data input of slave latch 120. The data output of slave latch 120 represents a data output (Q) of D flip-flop 100.

The clock inputs of latches 110 and 120 receive a clock signal (CLK). The enable input of master latch 110 receives an Enb1 signal, which enables or disables the master latch. Similarly, the enable input of slave latch 120 receives an Enb2 signal, which enables or disables the slave latch. The Enb1 and Enb2 signals may be control signals that indicate a sleep mode or may be some other control signals.

Master latch 110 samples the input data when the clock signal is at logic low, as indicated by a round bubble at the clock input of the master latch. Slave latch 120 samples the master latch output data when the clock signal is at logic high, as indicated by the lack of a round bubble at the clock input of the slave latch.

In an embodiment, master latch 110 is implemented with LVT transistors (which are also called LVT devices) and a first set of at least one control switch. Each control switch may be a footswitch or a headswitch. A footswitch couples one or more transistors to a low power supply (Vss). A headswitch couples one or more transistors to a high power supply (Vdd). Slave latch 120 is implemented with mostly HVT transistors. Slave latch 120 further includes an output driver that is implemented with LVT transistors and a second set of at least one control switch. The LVT transistors provide high speed of operation. The control switches reduce leakage current for the LVT transistors when the D flip-flop is disabled.

Figure 2:
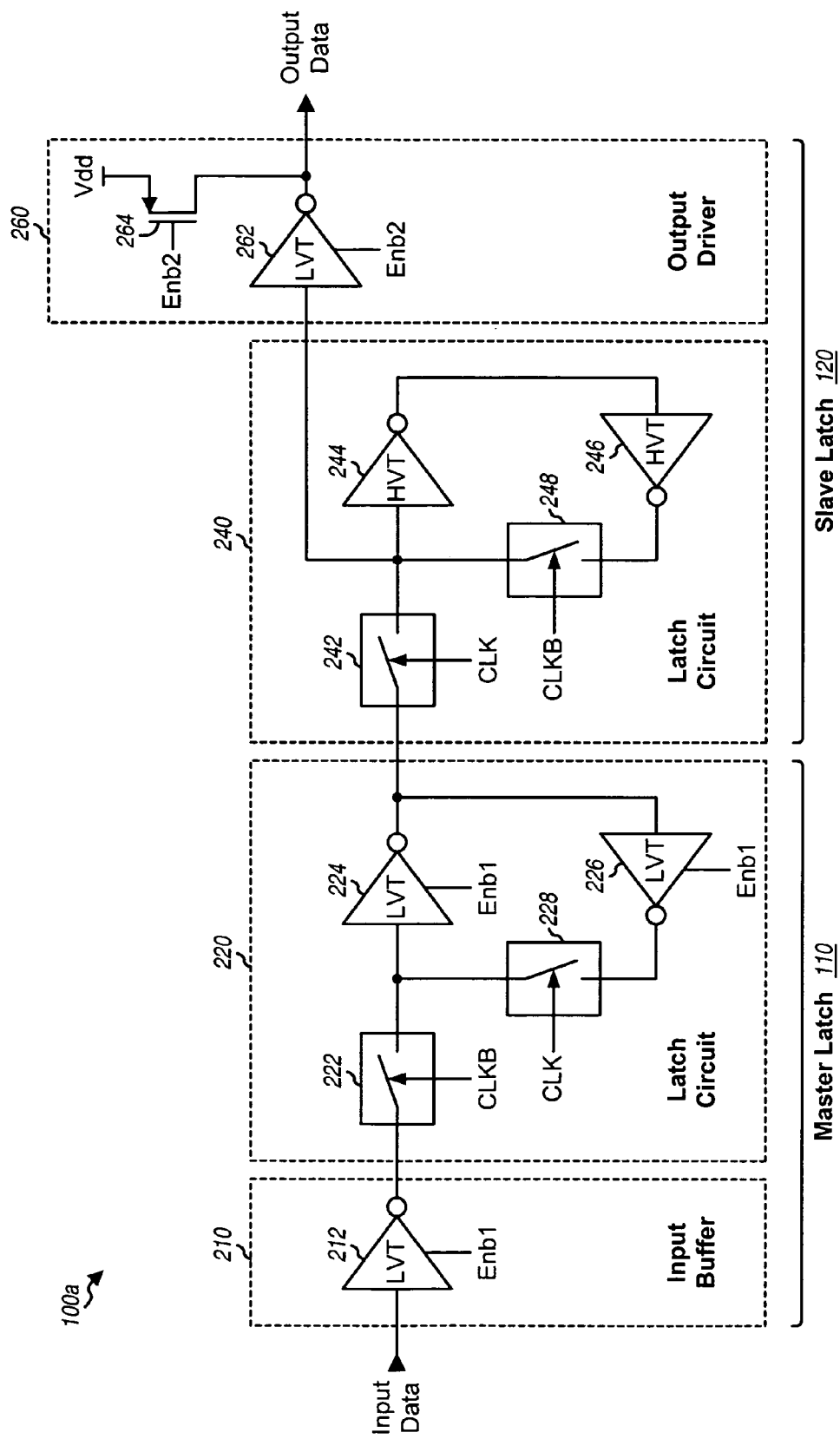
FIG. 2 shows an embodiment of the D flip-flop in FIG. 1.

FIG. 2 shows a block diagram of a D flip-flop 100a, which is an embodiment of D flip-flop 100 in FIG. 1. For this embodiment, master latch 110 includes an input buffer 210 and a latch circuit 220. Slave latch 120 includes a latch circuit 240 and an output driver 260.

For master latch 110, input buffer 210 is implemented with an inverter 212, and latch circuit 220 is implemented with pass switches 222 and 228 and inverters 224 and 226. The input of inverter 212 represents the D input of D flip-flop 100a. The output of inverter 212 couples to one end of switch 222. The other end of switch 222 couples to the input of inverter 224 and to one end of switch 228. The output of inverter 224 couples to the input of inverter 226 and also represents the data output of master latch 110. The output of inverter 226 couples to the other end of switch 228. Switch 222 is controlled by an inverted clock signal (CLKB) and turns on when the clock signal is at logic low. Switch 228 is controlled by the clock signal and turns on when the clock signal is at logic high.

Inverters 212, 224, and 226 are implemented with LVT transistors and at least one control switch that is enabled or disabled by the Enb1 signal. Pass switches 222 and 228 are also implemented with LVT transistors but do not need any control switches since these LVT transistors are not coupled directly between the high and low power supplies.

For slave latch 120, latch circuit 240 is implemented with pass switches 242 and 248 and inverters 244 and 246, and output buffer 260 is implemented with an inverter 262 and a pull-up transistor 264. One end of switch 242 couples to the output of master latch 110. The other end of switch 242 couples to the inputs of inverters 244 and 262 and to one end of switch 248. The output of inverter 244 couples to the input of inverter 246. The output of inverter 246 couples to the other end of switch 248. Switch 242 is controlled by the clock signal and turns on when the clock signal is at logic high. Switch 248 is controlled by the inverted clock signal and turns on when the clock signal is at logic low. Inverter 262 provides signal drive, and the output of inverter 262 represents the Q output of D flip-flop 100a. Pull-up transistor 264 has a source that couples to the Vdd power supply, a gate that receives the Enb2 signal, and a drain that couples to the output of inverter 262.

Inverters 244 and 246 and pass switches 242 and 248 are implemented with HVT transistors. No control switches are used for inverters 244 and 246 and pass switches 242 and 248 to allow latch circuit 240 to retain the logic value for D flip-flop 100a when the flip-flop is disabled. Inverter 262 is implemented with LVT transistors and at least one control switch that is enabled or disabled by the Enb2 signal.

D flip-flop 100a operates as follows. Master latch 110 is enabled when the Enb1 signal is at logic high and disabled when the Enb1 signal is at logic low. When enabled, inverter 212 receives and buffers the input data and provides the buffered data to switch 222. When the clock signal is at logic low, switch 222 is turned on and switch 228 is turned off. Switch 222 provides the buffered data to the input of inverter 224, and the internal capacitances of inverters 224 and 226 are charged to a logic value that is determined by the buffered data. When the clock signal is at logic high, switch 222 is turned off and switch 228 is turned on. Inverters 224 and 226 then operate in a closed loop feedback configuration and retain the precharged logic value. Latch circuit 220 effectively samples the input data when the clock signal is at logic low and holds the sampled data when the clock signal is at logic high.

For slave latch 120, latch circuit 240 is enabled at all time, and output driver 260 is enabled when the Enb2 signal is at logic high and disabled when the Enb2 signal is at logic low. Latch circuit 240 operates in the same manner as latch circuit 220, except that latch circuit 240 samples and holds data using the opposite clock polarity. When the clock signal is at logic high, switch 242 is turned on and switch 248 is turned off. Switch 242 provides the latched data from master latch 110 to the input of inverter 244, and the internal capacitances of inverters 244 and 246 are charged to a logic value that is determined by the latched data. When the clock signal is at logic low, switch 242 is turned off and switch 248 is turned on. Inverters 244 and 246 then operate in a closed loop feedback configuration and retain the precharged logic value. Latched circuit 240 effectively samples the latched data from master latch 110 when the clock signal is at logic high and holds the sampled data when the clock signal is at logic low. The clock signal should also be at logic low when D flip-flop 100a is disabled (e.g., during sleep mode) so that latch circuit 240 can save the logic state of the flip-flop.

Within output driver 260, inverter 262 receives and buffers the logic value from switch 242 and provides the required signal drive for the output data from D flip-flop 100a. Pull-up transistor 264 pulls the output of slave latch 120 to a known logic value when D flip-flop 100a is disabled.

FIG. 2 shows a specific embodiment of master latch 110 and slave latch 120. D flip-flop 100a may also be implemented with other designs, and this is within the scope of the invention. FIG. 2 shows an implementation of the D flip-flop using pass gates. The D flip-flop may also be implemented using tri-state drivers, as described below.

Figure 3:
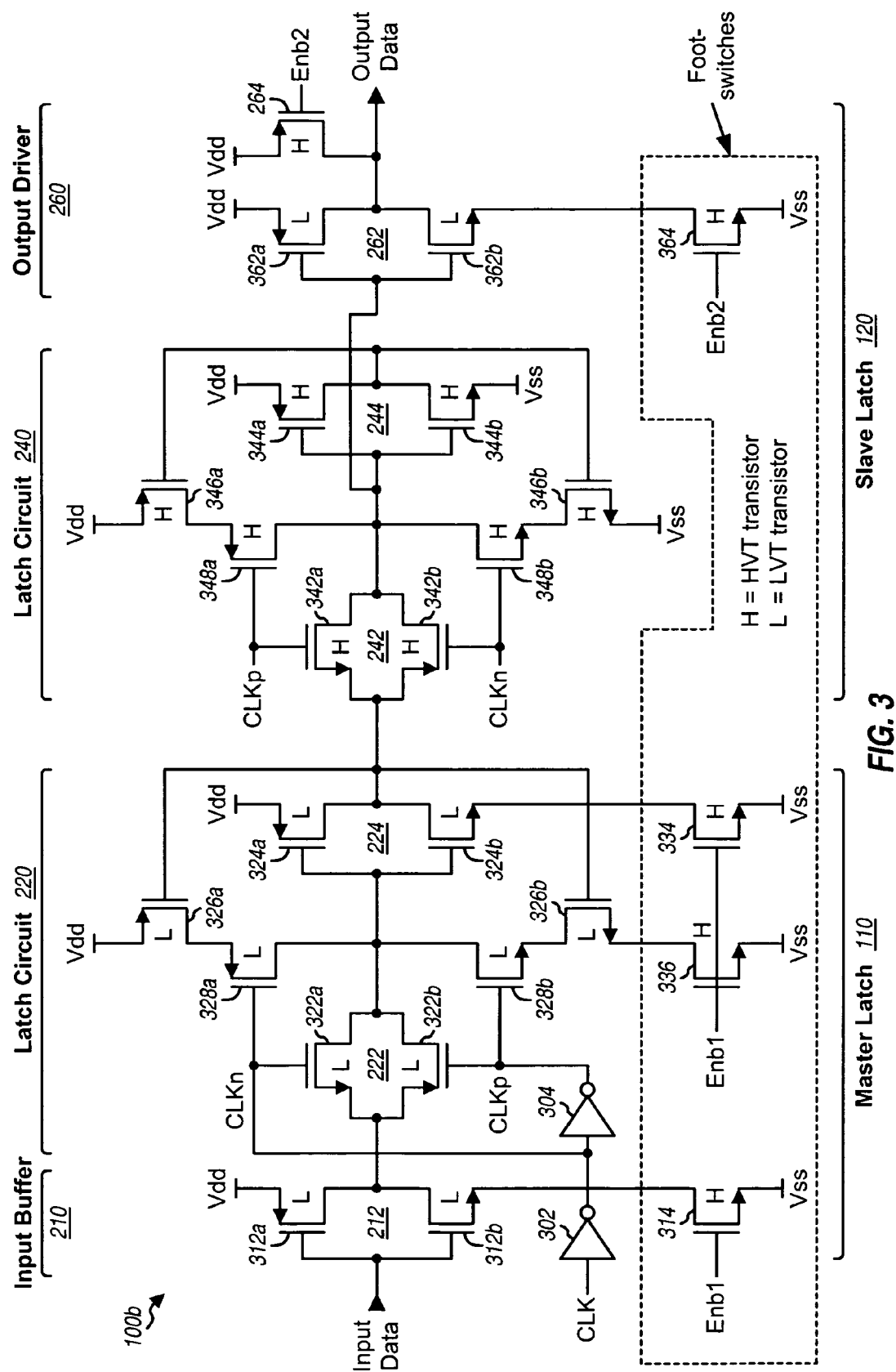
FIG. 3 shows an embodiment of the D flip-flop in FIG. 1 in CMOS.

FIG. 3 shows a schematic diagram of a D flip-flop 100b, which is an embodiment of D flip-flop 100a in FIG. 2 using CMOS transistors. For master latch 110, inverter 212 within input buffer 210 is implemented with a P-FET 312a and an N-FET 312b, which are coupled as an inverter. The gates of FETs 312a and 312b couple together and form the inverter input, the drains of FETs 312a and 312b couple together and form the inverter output, the source of P-FET 312a couples to the Vdd power supply, and the source of N-FET 312b couples to the Vss power supply via an N-FET 314. N-FET 314 couples in series with FETs 312a and 312b and acts a footswitch that enables or disables inverter 212 based on the Enb1 signal.

Pass switch 222 is implemented with an N-FET 322a and a P-FET 322b, which are coupled in parallel. The gate of N-FET 322a receives an inverted clock signal (CLKn) from an inverter 302. The gate of P-FET 322b receives a buffered clock signal (CLKp) from an inverter 304. Inverters 302 and 304 are coupled in series, with the input of inverter 302 receiving the clock signal CLK. When the CLK signal is at logic low, the logic high on the CLKn signal turns on N-FET 322a, and the logic low on the CLKp signal turns on P-FET 322b. When the CLK signal is at logic high, the logic low on the CLKn signal turns off N-FET 322a, and the logic high on the CLKp signal turns off P-FET 322b.

Inverter 224 is implemented with a P-FET 324a and an N-FET 324b, which are coupled as an inverter. An N-FET 334 couples in series with FETs 324a and 324b and acts a footswitch that enables or disables inverter 224 based on the Enb1 signal.

Inverter 226 is implemented with a P-FET 326a and an N-FET 326b. Pass switch 228 is implemented with a P-FET 328a and an N-FET 328b. P-FET 326a has a source that couples to the Vdd power supply, a gate that couples to the output of inverter 224, and a drain that couples to the source of P-FET 328a. P-FET 328a has a gate that receives the CLKn signal and a drain that couples to the input of inverter 224. N-FET 326b has a source that couples to the Vss power supply via an N-FET 336, a gate that couples to the output of inverter 224, and a drain that couples to the source of N-FET 328b. N-FET 328b has a gate that receives the CLKp signal and a drain that couples to the input of inverter 224.

When the CLK signal is at logic high, the logic low on the CLKn signal turns on P-FET 328a, and the logic high on the CLKp signal turns on N-FET 328b. When the CLK signal is at logic low, the logic high on the CLKn signal turns off P-FET 328a, and the logic low on the CLKp signal turns off N-FET 328b. N-FET 336 couples in series with FETs 326a, 326b, 328a and 328b and acts a footswitch that enables or disables inverter 226 based on the Enb1 signal.

For slave latch 120, pass switch 242 is implemented with an N-FET 342a and a P-FET 342b. Inverter 244 is implemented with a P-FET 344a and an N-FET 344b. Inverter 246 is implemented with a P-FET 346a and an N-FET 346b. Pass switch 248 is implemented with a P-FET 348a and an N-FET 348b. The P-FETs and N-FETs for pass switches 242 and 248 and inverters 244 and 246 within latch circuit 240 are coupled in the same manner as the corresponding P-FETs and N-FETs for pass switches 222 and 228 and inverters 224 and 226, respectively, within latch circuit 220 for master latch 110. All of the P-FETs and N-FETs for latch circuit 240 are implemented with HVT transistors. Footswitches and headswitches are not needed for latch circuit 240.

For output buffer 260, inverter 262 is implemented with a P-FET 362a and an N-FET 362b, which are coupled as an inverter. An N-FET 364 couples in series with FETs 362a and 362b and acts a footswitch that enables or disables inverter 262 based on the Enb2 signal. P-FET 264 pulls the Q output of D flip-flop 100b to logic high based on the Enb2 signal.

For D flip-flop 100b, N-FETs 314, 334, 336 and 364 are footswitches and are implemented with HVT transistors. Headswitches may also be used in place of, or in additional to, the footswitches. P-FETs 264 is a pull-up transistor and is also implemented with an HVT transistor. All other N-FETs and P-FETs within master latch 110 may be implemented with LVT transistors. All other N-FETs and P-FETs within slave latch 120 may be implemented with HVT transistors.

In general, at least one control switch is used to enable or disable the LVT transistors and to provide low leakage path for these LVT transistors in the D flip-flop. Separate sets of one or more control switches may be used for the master latch and the slave latch, and these sets may be controlled by separate enable signals, as shown in FIGS. 2 and 3. Alternatively, one set of one or more control switches may be used for both the master and slave latches and may be controlled by a single enable signal.

FIGS. 1, 2 and 3 are for rising edge flip-flops. Falling edge flip-flops may also be implemented in similar manner. For a falling edge flip-flop, the clock signal is at logic high during sleep, the master latch is not transparent and the slave latch is transparent. Hence, the master latch may be implemented with HVT transistors, and the slave latch may be implemented with LVT transistors and at least one control switch in order to save state during the sleep mode.

D flip-flop 100a in FIG. 2 and D flip-flop 100b in FIG. 3 provide various advantages. First, these D flip-flops can achieve high speed of operation. The master latch for each D flip-flop is composed of LVT transistors and the setup time for the flip-flop can be reduced. The output driver is also composed of LVT transistors and the clock-to-output time is reduced. Second, these D flip-flops have low leakage current. When these D flip-flops are disabled (e.g., during sleep mode), the control switches are turned off and prevent high leakage current via the LVT devices. Third, each D flip-flop can retain its logic state when disabled. The logic state of each D flip-flop is saved in the slave latch since this latch is composed of HVT devices without a control switch.

For clarity, the multi-threshold MOS circuits have been specifically described for D flip-flops. The multi-threshold MOS circuits may also be used for other types of flip-flops such as JK flip-flops, RS flip-flops, and so on. The multi-threshold MOS circuits may be used for any circuit block comprising a master latch formed with one type of transistors (HVT or LVT transistors), combinatorial logic, and a slave latch formed with another type of transistors (LVT or HVT transistors).

The multi-threshold MOS circuits described herein may be used for various applications such as communication, networking, computing, consumer electronics, and so on. The multi-threshold MOS circuits may also be used in various electronic devices and especially for portable devices such as wireless communication devices, cellular phones, wireless digital personal assistants (PDA), wireless modem modules, laptop computers, and other digital circuits that use flip-flops. The use of the multi-threshold MOS circuits for a wireless device is described below.

Figure 4:
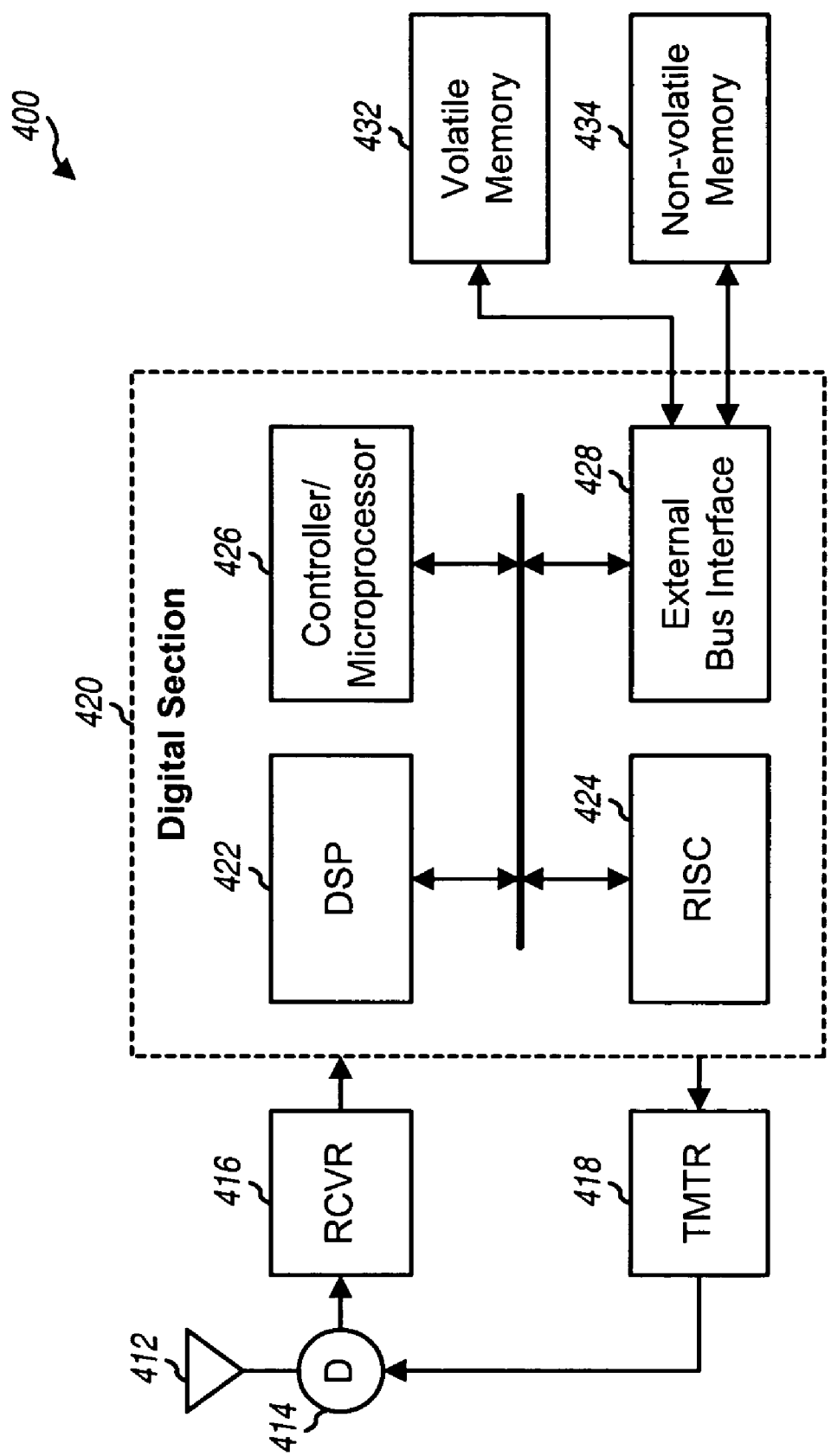
FIG. 4 shows a block diagram of a wireless device.

FIG. 4 shows a block diagram of a wireless device 400 that may advantageously employ the multi-threshold MOS circuits. Wireless device 400 may be a cellular phone, a terminal, a handset, or some other apparatus. Wireless device 400 may be capable of communicating with a code division multiple access (CDMA) system, a time division multiple access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and/or some other wireless communication systems and networks. A CDMA system may implement Wideband-CDMA (W-CDMA), cdma2000, or some other radio access technology. A WLAN may be an IEEE 802.11 network, a Bluetooth network, or some other wireless network.

Wireless device 400 provides bi-directional communication via a receive path and a transmit path. For the receive path, forward link signals transmitted by base stations are received by an antenna 412, routed through a duplexer (D) 414, and provided to a receiver unit (RCVR) 416. Receiver unit 416 conditions and digitizes the received signal and provides input samples to a digital section 420 for further processing. For the transmit path, a transmitter unit (TMTR)

418 receives from digital section 420 data to be transmitted, processes and conditions the data, and generates a reverse link signal, which is routed through duplexer 414 and transmitted via antenna 412 to the base stations.

Digital section 420 includes various processing units and interface units such as, for example, a digital signal processor (DSP) 422, a reduced instruction set computer (RISC) 424, a controller/microprocessor 426, and an external bus interface (EBI) 428. DSP 422 and/or RISC 424 may implement (1) a modem processor that performs processing for data transmission and reception (e.g., encoding, modulation, demodulation, decoding, and so on), (2) a video processor that performs processing on still images, moving videos, moving texts, and so on, (3) a graphics processor that performs processing on graphics for video games, 3-D avatars, and so on, and/or (4) other processors for other applications. EBI 428 facilitates transfer of data between digital section 420 and a volatile memory 432 and a non-volatile memory 434. Volatile memory 432 may be a RAM, an SRAM, a DRAM, an SDRAM, and so on. Non-volatile memory 434 may be a Flash memory, a ROM, and so on. The multi-threshold MOS circuits may be used for any or all of the units within digital section 420 and/or for memories 432 and 434.

The multi-threshold MOS circuits may be used in various types of IC such as application specific integrated circuits (ASICs), DSPs, RISCs, digital signal processing devices (DSPDs), programmable logic devices (PLDs), field programmable gate arrays (FPGAs), processors, controllers, micro-controllers, microprocessors, and so on. The multi-threshold MOS circuits may also be fabricated in various IC process technologies such as CMOS, N-MOS, P-MOS, bipolar-CMOS (Bi-CMOS), and so on. CMOS technology can fabricate both N-FET and P-FET devices on the same die, whereas N-MOS technology can only fabricate N-FET devices and P-MOS technology can only fabricate P-FET devices. The multi-threshold MOS circuits may be fabricated using different device size technologies (e.g., 0.13 mm, 30 nm, and so on). In general, the multi-threshold MOS circuits are more effective and beneficial as IC process technology scales to smaller "feature" or device length.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising at least one multi-threshold flip-flop, each multi-threshold flip-flop comprising:
   a master latch comprised of low threshold (LVT) transistors;
   a slave latch operative to sample and hold output data from the master latch for the multi-threshold flip-flop and comprised of first and second inverters formed with high threshold (HVT) transistors and coupled in a feedback configuration, and
   first and second pass switches formed with HVT transistors, the first pass switch being coupled to an input of the first inverter, and the second pass switch being coupled within the feedback configuration; and
   at least one control switch operative to enable or disable the LVT transistors.

2. The integrated circuit of claim 1, wherein the master latch for each multi-threshold flip-flop comprises
   a latch circuit comprised of LVT transistors and operative to sample and hold input data, and
   wherein the at least one control switch is operative to enable or disable the LVT transistors for the latch circuit.

3. The integrated circuit of claim 2, wherein the latch circuit in the master latch for each multi-threshold flip-flop comprises
   first and second inverters formed with LVT transistors and coupled in a feedback configuration, and
   first and second pass switches formed with LVT transistors, the first pass switch being coupled to an input of the first inverter and the second pass switch being coupled within the feedback configuration.

4. The integrated circuit of claim 2, wherein the master latch for each multi-threshold flip-flop further comprises
   an input buffer comprised of LVT transistors and operative to buffer the input data and provide buffered data to the latch circuit, and wherein the at least one control switch is operative to enable or disable the LVT transistors for the input buffer.

5. The integrated circuit of claim 1 wherein the slave latch for each multi-threshold flip-flop further comprises
   an output driver formed with LVT transistors and operative to provide signal drive for the multi-threshold flip-flop, and wherein the at least one control switch is operative to enable or disable the LVT transistors for the output driver.

6. The integrated circuit of claim 5, wherein the at least one control switch for each multi-threshold flip-flop comprises
   a first set of at least one footswitch configured to receive a first enable signal and operative to enable or disable the LVT transistors for the master latch based on the first enable signal, and
   a second set of at least one footswitch configured to receive a second enable signal and operative to enable or disable the LVT transistors for the output driver based on the second enable signal.

7. The integrated circuit of claim 1, wherein the slave latch for each multi-threshold flip-flop further comprises
   a pull-up transistor operative to pull an output of the multi-threshold flip-flop to a known logic state when the multi-threshold flip-flop is disabled.

8. The integrated circuit of claim 1, wherein the slave latch for each multi-threshold flip-flop is operative to retain a logic state of the multi-threshold flip-flop when the multi-threshold flip-flop is disabled.

9. The integrated circuit of claim 1, wherein the at least one multi-threshold flip-flop is operative to receive a clock signal that is maintained at a predetermined logic level when the least one multi-threshold flip-flop is disabled.

10. The integrated circuit of claim 1, wherein the at least one control switch comprises at least one footswitch.

11. The integrated circuit of claim 1, wherein the at least one control switch comprises at least one headswitch.

12. The integrated circuit of claim 1, wherein the least one control switch is formed with at least one HVT transistor.

13. The integrated circuit of claim 1, wherein the LVT transistors and the HVT transistors are metal oxide semiconductor (MOS) devices.

14. An integrated circuit comprising at least one multi-threshold flip-flop, each multi-threshold flip-flop comprising:

a master latch comprised of an input buffer formed with low threshold (LVT) transistors and a first latch circuit formed with LVT transistors;

a slave latch operative to sample and hold output data from the master latch for the multi-threshold flip-flop and comprised of a second latch circuit comprising first and second inverters formed with high threshold (HVT) transistors and coupled in a feedback configuration, first and second pass switches formed with HVT transistors, the first pass switch being coupled to an input of the first inverter, and the second pass switch being coupled within the feedback configuration, and an output driver formed with LVT transistors; and at least one control switch operative to enable or disable the LVT transistors for the input buffer, the first latch circuit, and the output driver.

15. The integrated circuit of claim 14, wherein the slave latch for each multi-threshold flip-flop is operative to retain a logic state of the multi-threshold flip-flop when the multi-threshold flip-flop is disabled.

16. The integrated circuit of claim 14, wherein the least one control switch for each multi-threshold flip-flop is formed with at least one HVT transistor.

17. The integrated circuit of claim 14, wherein the LVT transistors and the HVT transistors are N-channel field effect transistors (N-FLTs), P-channel field effect transistors (P-FETs), or a combination thereof.

* * * * *